United States Patent [19]

Abe

[11] Patent Number: 4,750,090

[45] Date of Patent: Jun. 7, 1988

[54] ELECTRICAL ASSEMBLY HAVING MULTIPLE SLIDABLE ELEMENTS

[75] Inventor: Hideki Abe, Miyagi, Japan

[73] Assignee: Alps Electric Co., Ltd., Japan

[21] Appl. No.: 947,200

[22] Filed: Dec. 29, 1986

[30] Foreign Application Priority Data

Feb. 12, 1986 [JP] Japan .................................. 61-17446
Feb. 12, 1986 [JP] Japan .................................. 61-17447

[51] Int. Cl.⁴ ................................................ H05K 1/14

[52] U.S. Cl. .................................. 361/395; 200/16 C; 200/16 D; 338/164; 338/176; 338/183; 338/184; 338/199; 361/424

[58] Field of Search ........................... 200/16 C, 16 D; 338/161, 164, 176, 183, 184, 199; 361/400, 424, 380

[56] References Cited

U.S. PATENT DOCUMENTS

| | | | |
|---|---|---|---|
| 2,740,027 | 3/1956 | Budd et al. | 338/199 |
| 3,412,361 | 11/1968 | Lovejoy et al. | 338/183 |
| 3,550,059 | 12/1970 | Barden et al. | 338/183 |
| 3,996,550 | 12/1976 | Yano et al. | 338/161 |
| 4,325,103 | 4/1982 | Ito et al. | 361/424 |
| 4,370,515 | 1/1983 | Donaldson | 361/424 |
| 4,404,617 | 9/1983 | Ohyama et al. | 361/424 |
| 4,559,515 | 12/1985 | Takezawa | 338/176 |

*Primary Examiner*—A. D. Pellinen
*Assistant Examiner*—Gregory D. Thompson
*Attorney, Agent, or Firm*—Guy W. Shoup

[57] ABSTRACT

A multi-slider electrical assembly comprises a metal case having a channel-shaped cross-section mounted on a substrate. The case has parallel slits, and guide blocks are spaced apart in parallel within the case for guiding a plurality of sliders extending through the slits. The case has an engage projection and semi-projections on each side thereof formed at each corner on its side walls. The engage projections are bent in contact with metal layers on the bottom surface of the substrate, and the semi-projections bear on grounding layers on the upper surface of the substrate, in order to hold the substrate therebetween without crushing it and to provide a good ground for the case.

3 Claims, 4 Drawing Sheets

ELECTRICAL ASSEMBLY HAVING MULTIPLE SLIDABLE ELEMENTS

FIELD OF THE INVENTION

This invention relates to a multi-slider electrical assembly wherein a plurality of electrical devices such as slidable variable resistors and slidable switches are mounted on a single insulative substrate.

BACKGROUND OF THE INVENTION

Multi-slider electrical assemblies including slidable variable resistors or other slidable electrical devices are known and used in graphic equalizers. Such a multi-slider variable resistor or other variable electrical assembly generally comprises a substrate having conductive patterns such as resistor, collector or other elements printed thereon, and a case mounted on the substrate to define the outer margin of the assembly. Guide blocks are interposed between the substrate and the case to define a plurality of parallel slits, a plurality of carriers are received in the slits of the guide blocks and a plurality of sliders are each secured to the bottom surface of the carrier to slide on the conductive patterns when the carrier is moved. Each carrier has a lever extending upward through one of elongated grooves in the case to provide an external knob. When the lever is moved along the elongated groove, the associated slider moves on the conductive patterns to change its position and hence vary the electrical output of the device.

In the prior art multi-slider assembly, the case is a plastic resin molded piece, and the mold must be changed if a different number of grooves is required in the case. This causes an increase in the manufacturing cost of the assembly.

To overcome this drawback, the Applicant proposed an improvement disclosed in Japanese Utility Model Application No. 118838/1985 and shown in FIG. 8 of the present application.

As shown in FIGS. 6–8, a prior art case 8 is formed from a plated hoop-shaped metal sheet which is press-cut to provide a number of elongated grooves 8*a* and engage projections 8*d*. The elongated grooves 8*a* are to projectingly receive levers 4*a* of carriers 4 therein. After this, the metal sheet is cut along transverse lines (A—A line and B—B line) apart from the elongated grooves 8*a*. Subsequently, through holes 8*b* are punched, unnecessary engage projections 8*d* are removed, and the sheet is bent along lines C—C and D—D to form an upper plate 8*f* and two side walls 8*c*. The case 8 having a desired number of grooves as shown in FIG. 7 is obtained. As shown in FIG. 6, the case 8 is fixed to an insulative substrate 1 by bending the engage projections 8*d* on to the bottom surface of the substrate 1.

In the Applicant's prior proposal, the substrate 1 is made from phenolic or other insulative material which is so fragile that it is often crushed at portions grasped by the engage projections of the case 8.

Further, the metal case 8 operates as an antenna generating external noises in the circuit patterns unless the case 8 is reliably connected to ground.

OBJECT OF THE INVENTION

It is therefore an object of the invention to provide a multi-slider electrical assembly wherein the substrate made of relatively fragile insulative material is not crushed by the metal case engaging therewith.

A further object of the invention is to provide a multi-slider electrical assembly wherein the metal case is reliably connected to ground.

SUMMARY OF THE INVENTION

In the most preferred form of the invention, a metal case has engage projections along outer end margins of side walls thereof to be engagingly bent onto metal layers provided on the bottom surface of a substrate. The side walls of the metal case are configured at end portions thereof to reliably contact grounding conductive patterns formed on the upper surface of the substrate.

Since the engage projections of the case side walls engage the metal layers on the bottom surface of the substrate and never directly contact the substrate material, the substrate is protected against crushing. The metal layers are readily formed on the bottom surface of the substrate simultaneously with conductive circuit patterns on the same surface.

Further, since the end portions of the case side walls contact the grounding conductive patterns on the upper surface of the substrate, the metal case is reliably grounded to prevent any external noises from entering in the circuit patterns.

BRIEF DESCRIPTION OF THE DRAWINGS

FIGS. 1 through 5 illustrate a multi-slider variable electrical assembly embodying the invention, in which:

FIG. 1 is a perspective view;

FIG. 2 is an exploded perspective view;

FIG. 3 is a fragmentary cross-sectional view;

FIG. 4 is a fragmentary enlarged side elevation where engage projections of a case graspingly engage a substrate; and FIG. 5 is a cross-sectional view taken along the E—E line of FIG. 4.

FIGS. 6 through 8 illustrate a prior art multi-slider variable electrical assembly, in which:

FIG. 6 is a perspective view;

FIG. 7 is a perspective view of a case; and

FIG. 8 is a perspective view of a semi-finished product for the case.

DETAILED DESCRIPTION

Figure 1:
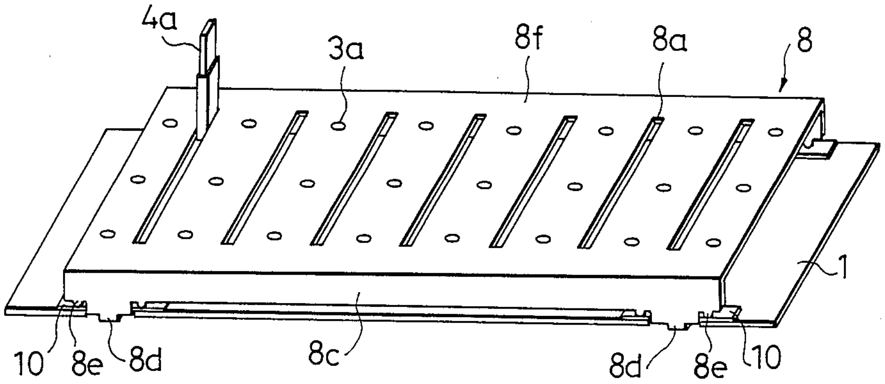
Figure 3:
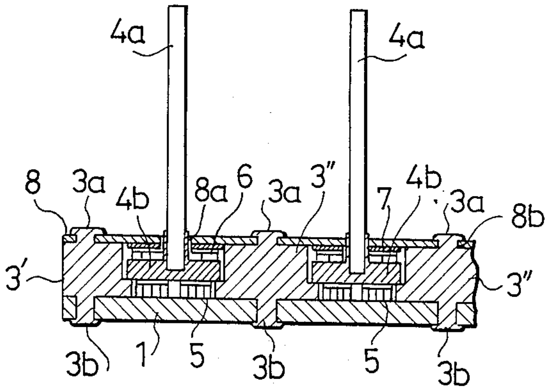
Figure 2:
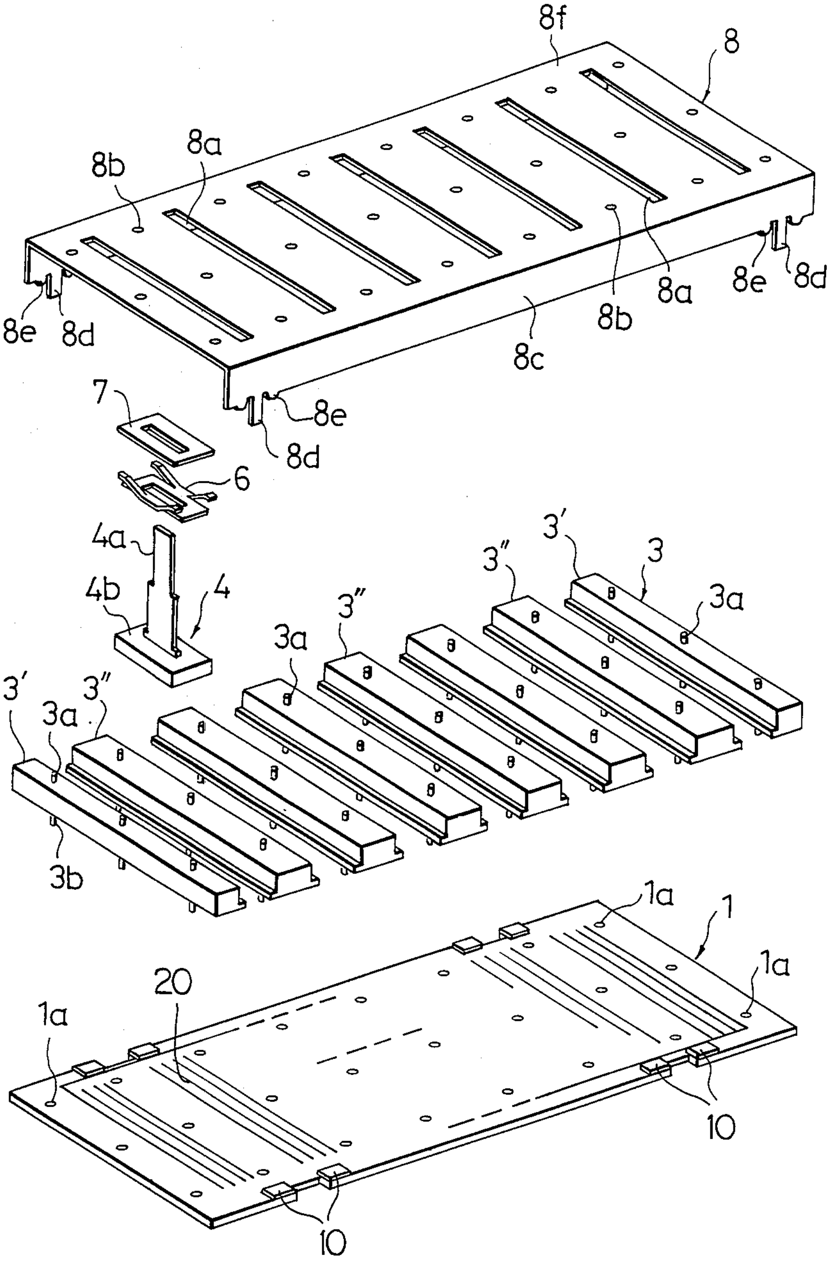

The invention is hereinbelow described in detail, referring to a preferred embodiment illustrated in the drawings.

Figure 4:
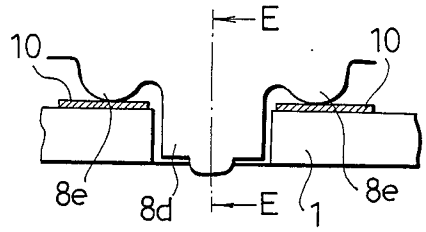
Figure 5:
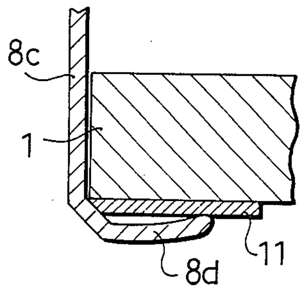
Figure 6:
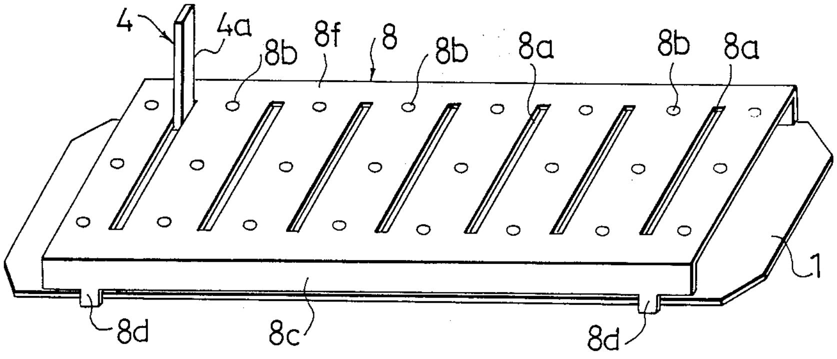
Fig. 6 PRIOR ART
Figure 7:
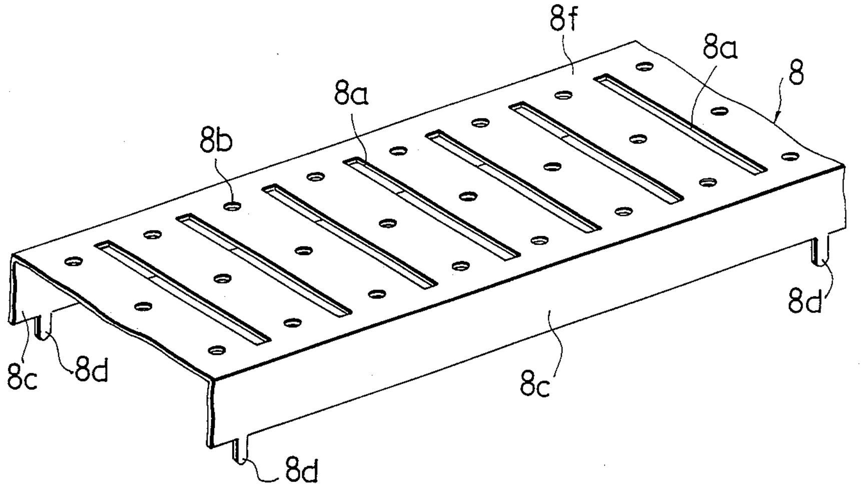
Fig. 7 PRIOR ART
Figure 8:
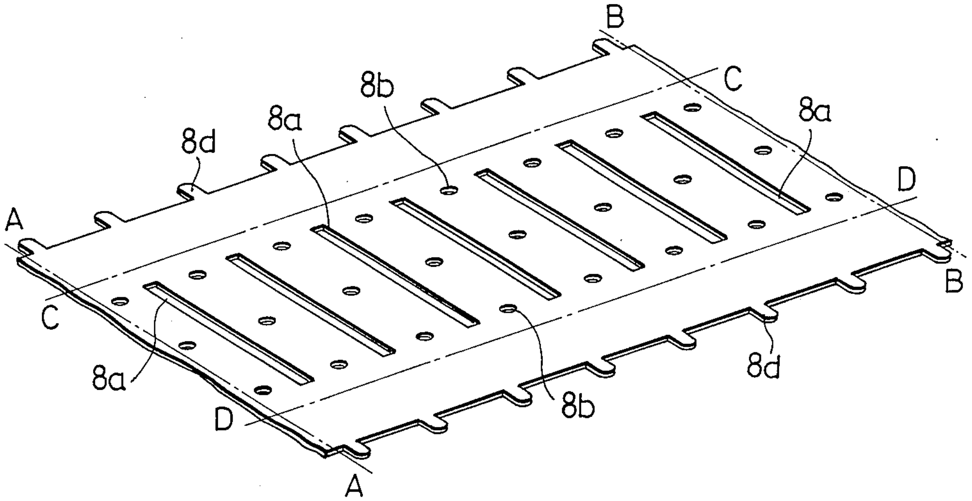
Fig. 8 PRIOR ART

In FIGS. 1 through 5 illustrating a multi-slider electrical assembly such as a multi-slider variable resistor assembly embodying the invention, identical or similar members as those in the prior art assembly of FIGS. 6 through 8 are designated by the same reference numerals.

The electrical assembly generally comprises a substrate 1 made from phenolic or other insulative material, a guide block means 3, a plurality of carriers 4, sliders 5, plate springs 6, spacers 7 and a case 8. The substrate 1 has resistors and collectors in the form of desired printed patterns generally designated 20 on the upper surface thereof, and a number of holes 1*a*. The substrate 1 is further provided with grounding conductive patterns 10 on the upper surface and metal layers 11 on the bottom surface thereof.

The guide block means 3 made from a plastic resin includes two first blocks 3' each having a step at one side thereof and some second blocks 3″ each having steps at both sides thereof. The first and second blocks 3′ and 3″ each have pins *3a* and *3b* projecting from the upper and lower surfaces thereof. The first blocks 3′ are located at opposite ends on the substrate 1 so that their steps are opposed to each other. The second blocks 3″ are parallel to the first blocks 3′ at a predetermined interval to define slits therebetween. The downward projecting pins *3b* of the first and second blocks 3′ and 3″ are inserted and hot-welded in the holes *1a* and the substrate 1 to unite the blocks 3′ and 3″ to the substrate 1.

Each carrier 4 includes a metal lever *4a* and a slider carrier *4b* which are united together. The slider 5 is secured to the bottom surface of the slider carrier *4b* by hot-welding or other fixing method. Each carrier 4 is accepted in the slit between adjacent first and second blocks 3′ and 3″ so that both ends of the slider carrier *4b* slidably engage the steps of the blocks.

The case 8 is an iron, aluminum, stainless steel or other metal plate and includes an upper plate *8f* and a pair of side walls *8c* vertically downwardly extending from the side margins of the upper plate *8f*. The upper plate *8f* has a plurality of transverse parallel elongated grooves *8a* corresponding to the number of the slits defined by the blocks 3′ and 3″. The upper plate *8f* is further provided with a number of through holes *8b* at both sides of and between the elongated grooves *8a*. Each side wall *8c* has engage projections *8d* at both end portions thereof and arcuate bulging portions *8e* at both sides of each engage projection *8d*.

The case 8 is manufactured by substantially the same process as that of the prior art metal case referred to in connection with FIG. 8 except that bulging portions *8e* are additionally formed in the present invention at both sides of each engage projection *8d*.

After the plate spring 6 and spacer 7 are mounted around the lever *4a* of the carrier 4, the case 8 is mounted on the guide block means 3 so that the lever *4a* passes through the elongated groove *8a*, and the upward pins *3a* of the blocks 3′ and 3″ engage the through holes *8b* of the upper plate *8f*. The pins *3a* are subsequently hot-welded in the through holes *8b* to unite the blocks 3′ and 3″ to the case 8. The side walls *8c* of the case 8 enclose the opposite sides of the case. Then the engage projections *8d* are bent onto the metal layers 11 on the bottom surface of the substrate 1 as shown in FIG. 5. At the same time, the outer ends of the bulging portions *8e* at both sides of the engage projections *8d* contact the grounding conductive patterns 10 on the upper surface of the insulative substrate 1 as shown in FIG. 4.

With this arrangement, when the lever *4a* of the carrier 4 is moved in and along the elongated groove *8a*, the slider 5 moves on the conductive patterns 20 on the substrate 1 to vary the resistance of the assembly in accordance with the position of the slider 5.

The case 8 in the described embodiment is readily configured to have a desired number of grooves by cutting it along desired transverse lines from a hoop-shaped metal sheet, and hence enables a mass-production of inexpensive multi-slider electrical assemblies.

The engage projections *8d* of the metal case 8 engage the metal layers along the bottom surface of the substrate and does not crush the substrate material.

The bulging portions *8e* at both sides of the respective engage projections *8d* along the margins of the case side walls *8c* contact the grounding conductive patterns 10 on the substrate and reliably connect the case 8 to ground so that no external noise enters in the patterns through the metal case 8. The semi-projections *8e* are not restricted to the illustrated configuration and positions, provided they establish a reliable connection between the case side walls *8c* and the grounding conductive patterns 10 on the substrate 1. If the metal layers 11 on the lower surface of the substrate 1 are configured as grounding conductive patterns, the metal case 8 contacts both grounding conductive patterns 10 and 11 on the upper and lower surfaces of the substrate 1 to establish a more reliable grounding.

The embodiments of the invention in which an exclusive property or privilege is claimed are defined as follows.

1. A multi-slider electrical assembly comprising:

a metal case having an upper plate formed with a plurality of parallel slits and two downwardly extending side walls on opposite sides thereof, said side walls having a joining section extending downwardly therefrom including a downwardly extending engage projection and a pair of shorter semi-projections adjacent each side of the engage projection;

an insulative substrate having circuit patterns on an upper surface thereof and a pair of grounding layers formed on an edge portion of said upper surface, and having a metal layer formed on an edge portion of a lower surface thereof in registration with the grounding layers;

a plurality of carriers disposed within the case each aligned with and having a lever thereon extending through a respective one of the slits of the case;

parallel sets of guide blocks interposed between the case and the substrate for guiding movement of each of the carriers; and a plurality of sliders each supported on a lower part of a respective one of the carriers and slidable on the circuit patterns on the substrate, wherein said metal case is joined by said joining section of said side walls to said substrate by said engage projection being bent in contact with said metal layer on the bottom surface of the substrate, and by said adjacent semi-projections bearing on the grounding layers on the upper surface of the substrate, whereby the case contacts the substrate through the grounding and metal layers so that it does not crush the substrate material and at the same time is grounded through the grounding layers.

2. A casing assembly for an electrical apparatus comprising:

a metal case having an upper plate and two downwardly extending side walls on opposite sides thereof, said side walls having a joining section extending downwardly therefrom including a downwardly extending engage projection and a pair of shorter semi-projections adjacent each side of the engage projection;

an insulative substrate having circuit patterns on an upper surface thereof and a pair of grounding layers formed on an edge portion of said upper surface, and having a metal layer formed on an edge portion of a lower surface thereof in registration with the grounding layers;

wherein said metal case is joined by said joining section of said side walls to said substrate by said engage projection being bent in contact with a respective metal layer on the bottom surface of the substrate, and by said adjacent semi-projections bearing on the grounding layers on the upper surface of the substrate, whereby the case contacts the substrate through the grounding and metal layers so that it does not crush the substrate material and at the same time is grounded through the grounding layers.

3. A casing assembly according to claim 2, wherein said side walls includes four corners and said joining section is provided at each of said corners.

* * * * *

UNITED STATES PATENT AND TRADEMARK OFFICE
CERTIFICATE OF CORRECTION

PATENT NO. : 4,750,090

DATED : June 7, 1988

INVENTOR(S) : HIDEKI ABE

It is certified that error appears in the above-identified patent and that said Letters Patent is hereby corrected as shown below: Title page:

In the Abstract, line 13, delete "ground" and insert --grounding--.

Signed and Sealed this

Tenth Day of January, 1989

*Attest:*

DONALD J. QUIGG

*Attesting Officer*

*Commissioner of Patents and Trademarks*